(12) United States Patent
Knaipp et al.

(10) Patent No.: US 9,076,880 B2
(45) Date of Patent: Jul. 7, 2015

(54) ASYMMETRIC HIGH-VOLTAGE JFET AND MANUFACTURING PROCESS

(75) Inventors: Martin Knaipp, Unterpremstaetten (AT); Georg Roehrer, Graz (AT)

(73) Assignee: ams AG, Unterpremstaetten (AT)

( * ) Notice: Subject to any disclaimer, the term of this patent is extended or adjusted under 35 U.S.C. 154(b) by 707 days.

(21) Appl. No.: 13/359,146

(22) Filed: Jan. 26, 2012

(65) Prior Publication Data
US 2012/0187458 A1 Jul. 26, 2012

(30) Foreign Application Priority Data

Jan. 26, 2011 (DE) .......................... 10 2011 009 487

(51) Int. Cl.
*H01L 29/80* (2006.01)
*H01L 21/337* (2006.01)
*H01L 29/808* (2006.01)
*H01L 29/06* (2006.01)
*H01L 29/66* (2006.01)

(52) U.S. Cl.
CPC .......... *H01L 29/808* (2013.01); *H01L 29/0692* (2013.01); *H01L 29/66901* (2013.01)

(58) Field of Classification Search
CPC .................. H01L 29/0692; H01L 29/66901; H01L 29/808
USPC ....................................... 257/256
See application file for complete search history.

(56) References Cited

U.S. PATENT DOCUMENTS

| 7,977,714 B2 * | 7/2011 | Ellis-Monaghan et al. .. 257/270 |
| 2006/0118813 A1 * | 6/2006 | Harada et al. ................. 257/134 |
| 2007/0278573 A1 * | 12/2007 | Knaipp ...................... 257/344 |
| 2008/0067560 A1 | 3/2008 | Knaipp |
| 2009/0206375 A1 | 8/2009 | Saha et al. |

FOREIGN PATENT DOCUMENTS

| DE | 44 25 337 | 1/1996 |
| DE | 10 2004 009 521 | 9/2005 |
| DE | 10 2004 018 153 | 12/2005 |

* cited by examiner

*Primary Examiner* — Ermias Woldegeorgis
*Assistant Examiner* — Benjamin Tzu-Hung Liu
(74) *Attorney, Agent, or Firm* — McDermott Will & Emery LLP

(57) ABSTRACT

A high voltage JFET has a deep well of a first type of conductivity made in a semiconductor substrate, a further well of an opposite second type of conductivity arranged in the deep well, a shallow well of a first type of conductivity arranged in the further well, a first contact region for source and a second contact region for drain arranged in the further well, a third contact region for gate arranged between the first contact region and the second contact region in the shallow well, a first distance between the first contact region and the third contact region being smaller than a second distance between the second contact region and the third contact region, and an electrical connection between the first contact region and the second contact region via at least one channel region present between the deep well and the shallow well in the further well.

9 Claims, 3 Drawing Sheets

US 9,076,880 B2

ASYMMETRIC HIGH-VOLTAGE JFET AND MANUFACTURING PROCESS

RELATED APPLICATIONS

This application claims the priority of German application no. 10 2011 009 487.3 filed Jan. 26, 2011, the entire content of which is hereby incorporated by reference.

FIELD OF THE INVENTION

The present invention concerns a JFET (junction gate field effect transistor) for the high-voltage region and an associated production process.

BACKGROUND OF THE INVENTION

In modern integrated circuits, which also include high-voltage transistors, various circuit blocks are operated at different voltage levels. For example, the gate control of high-voltage transistors can take place by means of low-voltage components. The voltage supply of the individual circuit blocks must in this case take place in a controlled way during the operating state. The electrically isolated high-voltage transistors in the substrate are in a cut-off state when the gate electrode is at the same potential as the transistor body, and therefore are not suitable for energizing the affected part of the circuit. Therefore, one seeks a possibility of energizing circuit blocks of an integrated circuit comprising low-voltage transistors and high-voltage transistors at different voltage levels. For this one in particular needs a high-voltage transistor component that is in the conducting state without gate-source bias.

DE 10 2004 009 521 A1 describes a high-voltage PMOS transistor, which has a gate electrode, p-source in an n-well, p-drain in a p-well arranged within the n-well, and a field oxide region between the gate electrode and drain. The n-well is not as deep under the drain as it is under the source, and the depth of the p-well is the greatest under the drain.

SUMMARY OF THE INVENTION

One object of the invention is to provide a high-voltage transistor component that is in the conducting state without gate-source bias. In addition, a manufacturing process for such a transistor component is to be provided.

This and other objects are attained in accordance with one aspect of the present invention directed to an asymmetric high-voltage JFET comprising a semiconductor substrate with an upper surface and a deep well of a first type of conductivity made in the semiconductor substrate. A further well is arranged on the upper side of the semiconductor substrate in the deep well and has a second conductivity that is opposite to the conductivity of the first type. A shallow well is arranged at the upper surface of the semiconductor substrate in the further well and has the first type of conductivity. A first contact region for source is arranged in the further well, and a second contact region for drain is arranged in the further well. A third contact region for gate is arranged between the first contact region and the second contact region in the shallow well. A first distance between the first contact region and the third contact region is smaller than a second distance between the second contact region and the third contact region. Within the further well there is an electric connection between the first contact region and the second contact region through at least one channel region present in the further well between the deep well and the shallow well.

In embodiments of the high-voltage JFET, the third contact region has a third distance from the further well in the direction toward the first contact region. The third contact region has a fourth distance from the further well in the direction toward the second contact region, and the third distance is smaller than the fourth distance.

In other embodiments the high-voltage JFET is symmetric with respect to a plane that is perpendicular to the upper surface of the semiconductor substrate, runs through the second contact region and does not run through the first contact region.

In other embodiments of the high-voltage JFET there is at least one transition region between the deep well and the shallow well, in which the deep well and the shallow well merge.

In other embodiments of the high-voltage JFET the third contact region has a plurality of spatially separated partial regions.

In other embodiments of the high-voltage JFET a transition region between the deep well and the shallow well is present under each of the partial regions of the third contact region.

In other embodiments of the high-voltage JFET the upper surface of the semiconductor substrate is covered with an isolation region between the second contact region and the third contact region. A drift region is provided within the further well between the shallow well and the second contact region. A field plate is arranged on the isolation region at least over one segment of the drift region.

In the method of producing an asymmetric high-voltage JFET a deep well of a first type of conductivity is produced, a further well of a second type of conductivity that is opposite to the first type of conductivity is produced within the deep well, and a shallow well of the first type of conductivity is produced within the further well in a semiconductor substrate by implantation of dopants. At least one channel region is provided within the further well between the deep well and the shallow well. A first contact region for source and a second contact region for drain are made in the further well, so that within the second well there is an electrical connection between the first contact region and the second contact region through the channel region. A third contact region for gate is made between the first contact region and the second contact region in the shallow well. The third contact region is arranged so that a first distance between the first contact region and the third contact region is smaller than a second distance between the second contact region and the third contact region.

A mask with a first mask opening and a second mask opening for implantation of the first type of conductivity is used in examples of the method. The mask covers a region provided between the second and the third contact region, between the first mask opening and the second mask opening.

In other examples of the method, an additional mask with a mask opening that extends over a region provided for the shallow well is used for an implantation of the second type of conductivity.

BRIEF DESCRIPTION OF THE DRAWINGS

The following is a detailed description of examples of the high-voltage JFET and the production method in conjunction with the attached drawings.

DETAILED DESCRIPTION OF THE DRAWINGS

Figure 1:
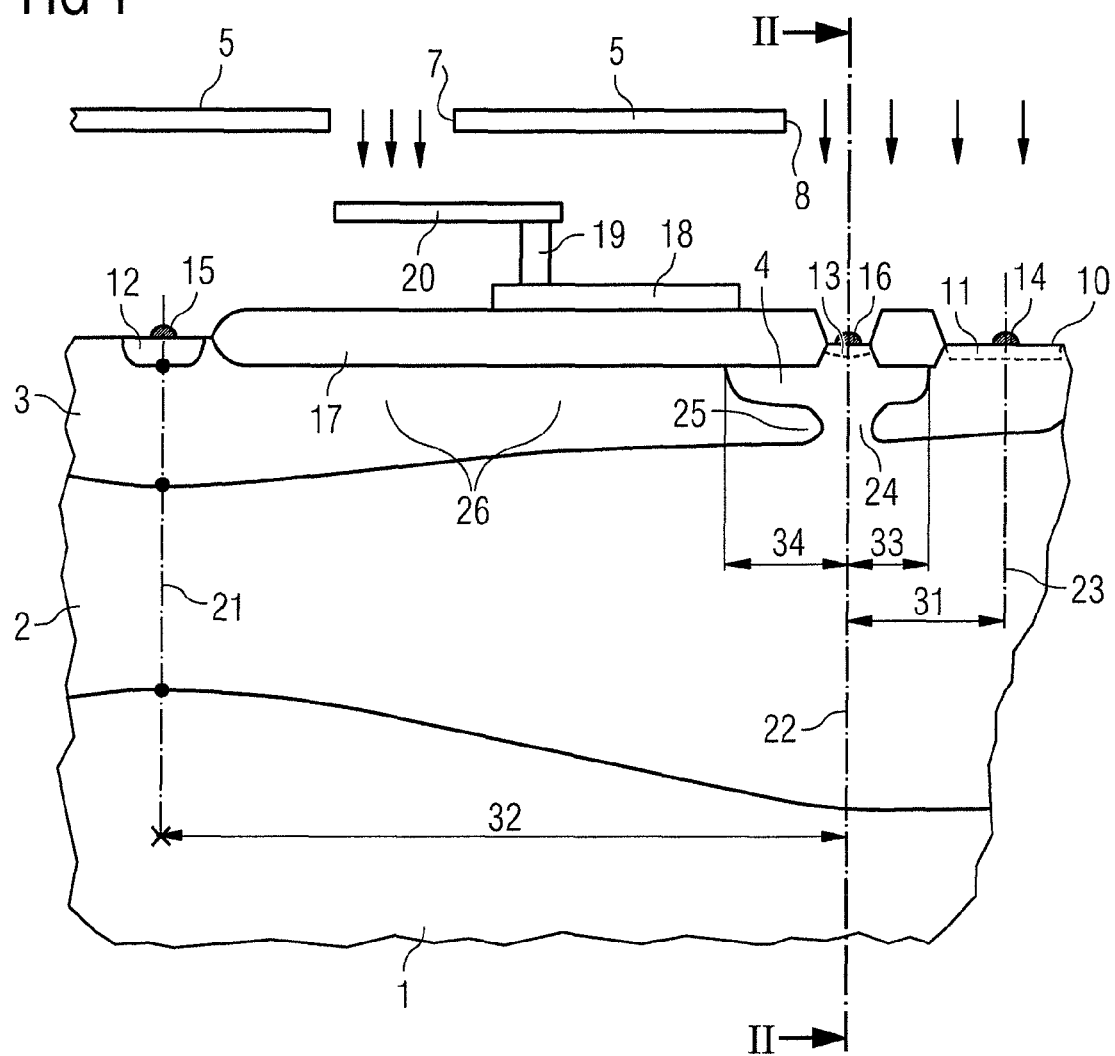
FIG. 1 shows an embodiment of the high-voltage JFET in cross section taken along line I-I in FIGS. 3 and 4.

FIG. 1 shows a cross section through a section of an embodiment of the high-voltage JFET. In a semiconductor substrate 1, for example made of silicon, a first deep well 2 of a first type of conductivity is made from an upper surface 10. A further well 3, which has a second conductivity type opposite to the first conductivity type, is arranged in the deep well 2.

In the case of a p-JFET the first conductivity type is n-conducting, and the second conductivity type in this case is p-conducting. However, for an n-JFET the signs of the conductivity types can be exchanged. To simplify the presentation, the conductivity types are given below for the example of p-JFET. The deep well 2 of the first conductivity type is accordingly called deep n-well 2, and the further well 3 of the opposite conductivity type is correspondingly called p-well 3.

A shallow well 4, which has the first conductivity type and is called shallow n-well 4 in the following, is arranged in the p-well 3. On the upper surface 10 of the semiconductor substrate 1 there is in the p well 3 a first contact region 11 for source and a second contact region 12 for drain. The first and second contact regions 11 and 12 are likewise doped for the second conductivity type, thus in this example for p-conductivity, but they have a higher dopant concentration than the p-well 3. Therefore, the first contact region 11 and the second contact region 12 can have low-ohmic contact on the upper surface with a source contact 14 or a drain contact 15, for example made of metal.

A third contact region 13, which is more heavily doped than the shallow n-well 4 for the first type of conductivity, thus in this example for n-conductivity, is arranged in the shallow n-well 4 on the upper surface 10. The third contact region 13 is provided for gate and can be provided on the upper surface with a gate contact 16. The gate contact 16 can be made of metal and is directly applied to the third contact region 13.

Outside of the contact regions 11, 12 and 13 the upper surface 10 of the semiconductor substrate 1 is preferably covered by an isolation region 17, which in particular can be an oxide of the semiconductor material, for example silicon dioxide. The isolation region 17 can, for example, be produced as field oxide or as shallow trench isolation (STI).

A first section line 21, a second section line 22 and a third section line 23 are indicated in FIG. 1. The first section line 21 runs perpendicular to the upper surface 10 through the middle of the second contact region 12 and in particular is a cross section line through a plane of symmetry of the JFET. The second section line 22 runs through the middle of the third contact region 13, and the third section line 23 runs through the middle of the first contact region 11. The distance between the second section line 22 and the third section line 23, called first distance 31 in what follows, defines a distance between the first contact region 11 and the third contact region 13, here in particular the distance between the middles of the first contact region 11 and the third contact region 13, and thus a distance between source and gate. The distance between the first section line 21 and the second section line 22 defines a second distance 32 between the drain and the gate. The first distance 31 is smaller than the second distance 32, so that this JFET is asymmetric with respect to the gate.

The asymmetric structure makes it possible to provide a mode of operation of the JFET in which the electrical potentials of source and gate are about the same and a comparably very high voltage, for example, typically 5 to 110 V, is present between gate and drain. For a typical gate voltage of 0 V and a typical source voltage of −8 V a current flows through the channel of the JFET in the region of a drain voltage of 0 to −5 V, while at drain voltages of −5 V to −110 V a constriction of the channel occurs, so that the transistor cuts off. At still lower drain voltages impact ionization begins, and a current flows again. The described JFET is, for example when the same electric potential is present at gate and source, in an on state and is suitable for supplying circuit blocks of circuitry consisting of high-voltage and low-voltage transistors with current.

The channel region 25 is situated within the p-well 3 under the third contact region 13. There can be a plurality of channel regions 25, each of which is interrupted by transition regions 24, in which the deep n-well 2 and the shallow n-well 4 merge, under a section of the third contact region 13. This is described below in more detail in conjunction with FIG. 2.

A drift region 26 is located in the p-well 3 between the channel region 25 and the second contact region 12 for drain. A field plate 18 is arranged on the isolation region 17 above the drift region 26 or at least over a segment of the drift region 26. The field plate 18 is electrically conducting. The field plate 18 can be connected by a vertical through-contact 19 to a first metal plane 20, in which an additional field plate, which enhances the effect produced by the field plate 18, can be structured. For example, in this way the field plate 18 can be made longer in the direction toward the drain as is indicated in the cross section of FIG. 1. Similar to the way a field plate present above the drift region can be electrically conductively connected to the gate electrode in a high-voltage transistor, in the case of the JFET in accordance with FIG. 1 the field plate 18 can also be electrically conductively connected to the gate contact 16; however, this does not have to be the case. The drain-side boundary between the shallow n-well 4 and the p-well 3 is preferably at a greater distance from the third contact region 13 than the source-side boundary between the shallow n-well 4 and the p-well 3, so that the third distance 33 indicated in FIG. 1 is smaller than the fourth distance 34. In a preferred embodiment the field plate 18 is not present above the shallow n-well 4.

From the cross section of FIG. 1 one can also recognize a typical arrangement of a mask 5, which is used for implantation of the deep n-well 2. The mask 5 has a first mask opening 7 and a second mask opening 8. Between the mask openings 7 and 8 the mask covers a region between the second and the third contact regions 12 and 13. The implantation of the dopant is indicated by the arrows pointing downward. However, this implantation preferably takes place in an earlier stage of the production process, before the p-well 3 and other components of the JFET structure are produced. Based on the arrangement of the mask openings 7 and 8, after diffusion of the dopant, there results a well profile that can be optimized with regard to the intended use of the JFET. In particular, it is possible to produce the deep n-well 2 so that its depth, measured from the upper surface 10 into the semiconductor substrate 1, exhibits a minimum under the second contact region 12, as can be seen from the first section line 21 in FIG. 1. The second mask opening 8 is particularly important with regard to the production of the transition regions 24 between the deep n-well 2 and the shallow n-well 4.

Figure 2:
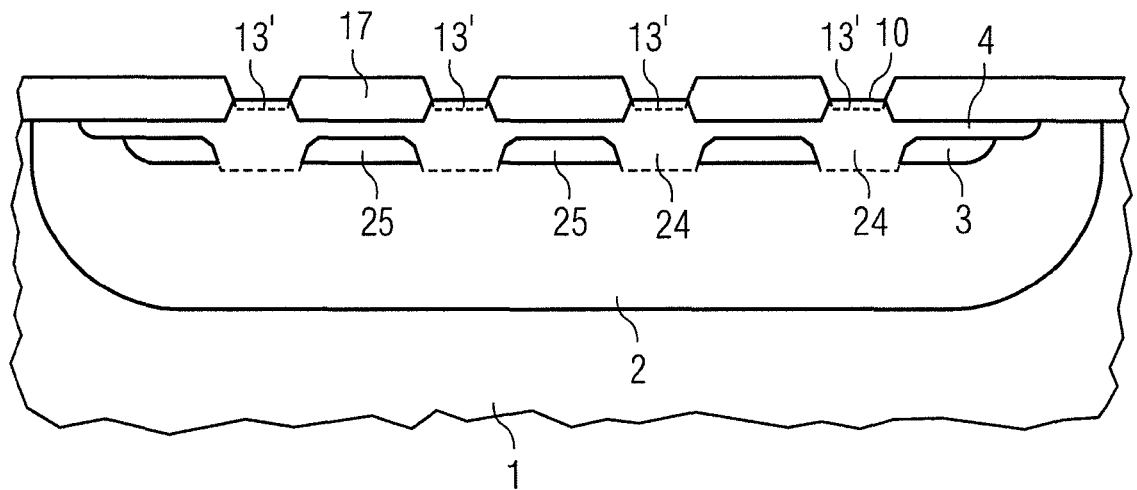
FIG. 2 shows the cross section taken along line II-II in FIG. 1.

FIG. 2 shows the cross section indicated in FIG. 1, the cross section plane of which is represented in FIG. 1 by the second section line 22. The deep n-well 2, the p-well 3 and the additional shallow n-well 4 arranged in the semiconductor substrate 1 are shown in FIG. 2. The cross section shown in FIG. 1 runs through one of the transition regions 24 that can be seen in FIG. 2, in which the deep n-well 2 and the shallow n-well 4 merge. Each of the transition regions 24 is situated under the partial regions 13' of the third contact region 13. Between these partial regions 13', the upper surface 10 of the semiconductor substrate 1 can be covered with the isolation region 17, as is shown in FIG. 2 as an example. In the cross-sectional plane of FIG. 2 the p-well 3 forms a plurality of channel regions 25, which form an electric connection within the p-well 3 between the second contact region 12 for drain and the first contact region 11 for source. These channel regions 25 can be controlled, particularly constricted, by the electric potential applied to the third contact region 13, particularly by means of the gate contact 16. If the first contact region 11 and the third contact region 13 are at approximately the same electric potential and the second contact region 13 is at a negative drain potential, a hole current is driven from source to drain. This JFET is thus in a state in which it is not necessary for a source-drain current to switch the transistor on separately. This JFET can therefore be used to energize circuit blocks that have been switched off within the integrated circuit.

The embodiment shown in FIG. 2, in which a plurality of channel regions 25 is present, is obtained in particular as a preferred embodiment when the shallow n-well 4 is made deeper than the isolation region 17. The shallow n-well 4 can, for example, be implanted through the isolation region 17 into the semiconductor material of the semiconductor substrate 1. Because of the shielding caused by the isolation region 17 the shallow n-well 4 under the region occupied by the isolation region 17 is in each case made shallower than under the open regions, in which the partial regions 13' of the third contact region 13 for gate are provided. This is why the transition regions 24 from the shallow n-well 4 to the deep n-well 2 are situated under these partial regions 13'. In other embodiments a continuous channel region 25 can be provided over the entire width of the p-well 3 instead. The width is the dimension transverse to the direction from source to drain, and is the dimension lying in the plane of the drawing of FIG. 2.

Figure 3:
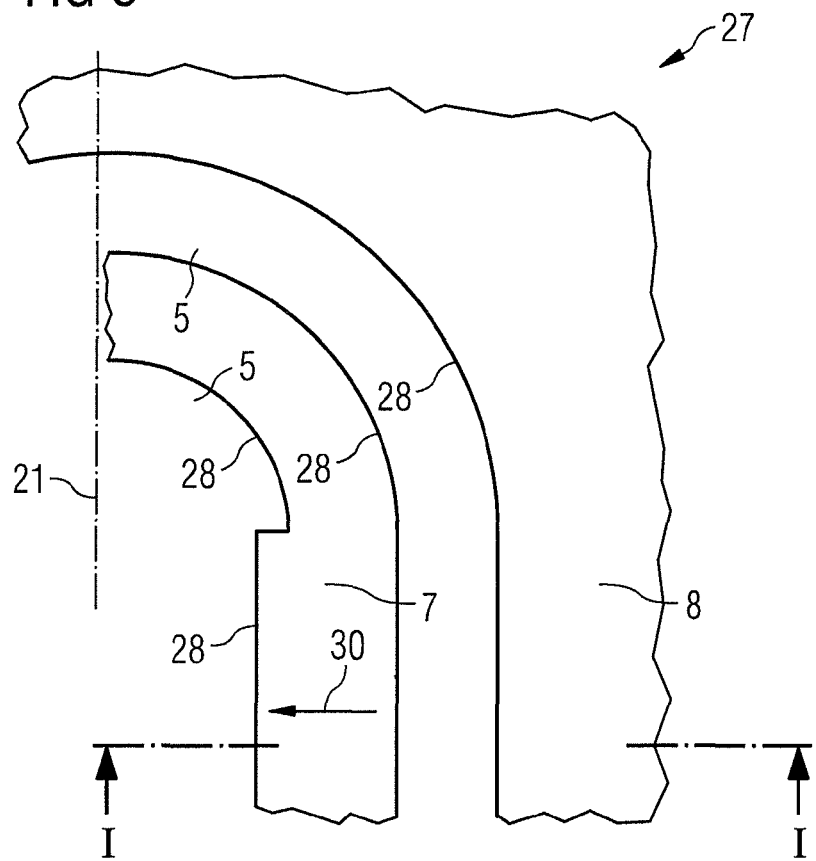
FIG. 3 shows a section of a mask used for the implantation of a well.

FIG. 3 shows a section from a mask 5 that can be used for implantation of the dopant for the first type of conductivity, in this example n-type conductivity. The section shown in FIG. 3 is situated on the transistor head 27, i.e., at a lateral end of the transistor with respect to the longitudinal direction of the channel. The position of the cross section according to FIG. 1 is indicated in FIG. 3. In addition, FIG. 3 shows the place at which the plane corresponding to the first section line 21 runs. This plane is perpendicular to the upper surface 10 of the semiconductor substrate 1 and, in a preferred embodiment, is also a plane of symmetry of the transistor structure. The first mask opening 7 and the second mask opening 8 are situated between the edges 28 of the mask 5. The arrow indicates the direction 30 of the current from source to drain.

Figure 4:
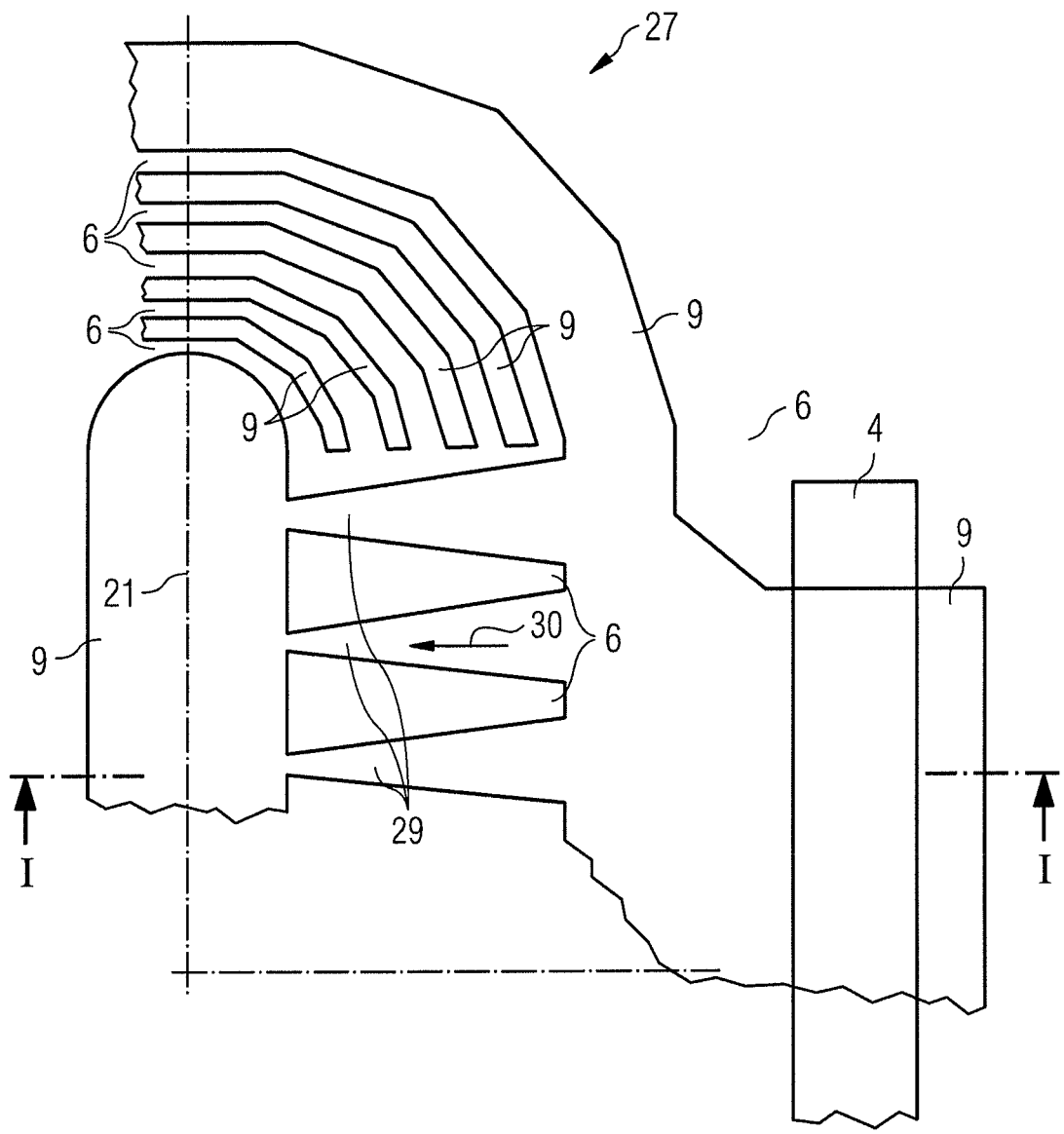
FIG. 4 shows a section of another mask used for an implantation.

FIG. 4 shows, in correspondence with FIG. 3, another mask 6 that can be used for implantation of the dopant for the second type of conductivity, in this example p-type conductivity. This mask 6 is also shown in a section in the vicinity of the transistor head 27. In this embodiment the mask opening 9 especially comprises strips 29 arranged along the direction 30 of the current and tapering in the direction towards drain. In this way a dopant profile that continuously changes from gate to drain is produced. In each case, according to the intended embodiment and the implantation dosage that is used, it is possible to use instead of the tapering strips 29, for example, strip-shaped mask openings with parallel edges that are directed along the current direction 30 or even whole-surface mask openings in the affected region.

In contrast to the production of a traditional high-voltage transistor, the mask opening 9 of this mask 6 even extends over the region of the shallow n-well 4 up to the source. Thus, the p-well 3 is formed up to the first contact region 11. In this way one obtains a continuous connection between source and drain through the channel region 25. It can also be seen from FIGS. 3 and 4 that the plane of symmetry of this embodiment runs through the second contact region 12 provided for drain, but not through the first contact region 11 provided for source. The plane of symmetry in this example is perpendicular to the current direction 30. The JFET in this embodiment is thus symmetric with respect to drain and asymmetric with respect to gate.

The well structure shown in FIG. 1, in which the deep n-well 2 reaches a maximum depth under the gate contact 16 and has a minimal depth under the drain contact 15 can be produced with the implantation masks as in FIGS. 3 and 4. The depth is the distance of the lower boundary of the deep n-well 2 from the upper surface 10 of the semiconductor substrate 1. The p-well 3 reaches its maximum depth under the drain contact 15. The drift region 26 is located between the region of the maximum depth of the p-well 3 and the channel region 25. Starting from the region of the gate contact 16, the shallow n-well 4 is stretched out a little further toward the drift region 26 than in the opposite direction, so that the shallow n-well is shifted asymmetrically toward the drift region 26 with respect to the gate contact 16, and the third distance 33 indicated in FIG. 1 is smaller than the fourth distance 34.

The described JFET has the advantage that the resistance in the on state is low, since the dimensions of the transistor are small and the electric resistance in the drift region is low compared to a symmetric JFET. This asymmetric JFET can therefore be preferably used in circuits in which the source and gate of the transistor are at about the same electric potential and a high voltage is only applied between gate and drain. The asymmetric JFET can be optimized to the extent that a RESURF (reduced surface field) condition can be established. The dosage used for this in the implantation of the dopant corresponds to a net drift doping. In the operation of the JFET the drift region becomes completely depleted of charge carriers if there is a sufficiently high gain-drain voltage present without premature avalanche breakdown taking place. The described masks are especially advantageous if a low thermal budget is intended. In particular, the tapering strips 29 of the mask opening of the mask 6 intended for implantation of the second conductivity type allows the RESURF condition to be appropriately established. The design with the transition regions 24 in correspondence with FIG. 2 in particular has the advantage that an intended electric potential can also be applied through the gate contact 16 to the deep n-well 2 and thus a separate contact for the deep n-well 2 is not necessary.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:
1. An asymmetric high-voltage JFET comprising:
    a semiconductor substrate with an upper surface;
    a deep well of a first type of conductivity in the semiconductor substrate;

a further well, which is arranged on the upper surface of the semiconductor substrate in the deep well and which has a second type of conductivity opposite to the first type of conductivity;

a shallow well, which is arranged on the upper surface of the semiconductor substrate in the further well and which has the first type of conductivity;

a first contact region for source arranged in the further well and a second contact region for drain arranged in the further well;

a third contact region for gate arranged between the first contact region and the second contact region in the shallow well; and a plurality of spatially separated partial regions of the third contact region, the plurality of spatially separated partial regions being separated by one or more isolation regions, wherein a first distance between the first contact region and the third contact region is smaller than a second distance between the second contact region and the third contact region, and wherein within the further well there is an electric connection between the first contact region and the second contact region via at least one channel region present between the deep well and the shallow well in the further well.

2. The high-voltage JFET of claim 1, wherein
the third contact region has, in the direction toward the first contact region, a third distance from the further well,
the third contact region has, in the direction toward the second contact region, a fourth distance from the further well, and
the third distance is smaller than the fourth distance.

3. The high-voltage JFET of claim 1, wherein
the JFET is symmetric with respect to a plane that is perpendicular to the upper surface of the semiconductor substrate, the plane of symmetry intersecting the second contact region but not the first contact region.

4. The high-voltage JFET of claim 1, further comprising:
at least one transition region between the deep well and the shallow well, wherein the deep well and the shallow well merge.

5. The high-voltage JFET of claim 4, further comprising:
a transition region between the deep well and the shallow well under each of the partial regions of the third contact region.

6. The high-voltage JFET of claim 1, further comprising:
an isolation region covering the upper surface of the semiconductor substrate between the second contact region and the third contact region;
a drift region provided within the further well between the shallow well and the second contact region; and
a field plate arranged on the isolation region at least above a section of the drift region.

7. A method of producing an asymmetric high-voltage JFET according to claim 1, comprising:
providing a semiconductor substrate;
producing a deep well of a first type of conductivity, a further well of a second type of conductivity that is opposite to the first type of conductivity within the deep well, and a shallow well of the first type of conductivity within the further well by implantation of dopant in the semiconductor substrate, between the deep well and the shallow well at least one channel region being provided within the further well;
producing a first contact region for source and a second contact region for drain in the further well, so that an electric connection exists within the further well between the first contact region and the second contact region via the channel region;
producing a third contact region for gate in the shallow well between the first contact region and the second contact region such that the third contact region comprises a plurality of spatially separated partial regions separated by one or more isolation regions; and
arranging the third contact region in such a manner that a first distance between the first contact region and the third contact region is smaller than a second distance between the second contact region and the third contact region.

8. The method of claim 7, further comprising:
a mask having a first mask opening and a second mask opening being used for an implantation of the first type of conductivity, and
between the first mask opening and the second mask opening the mask covering a region provided between the second and the third contact regions.

9. The method of claim 7, further comprising:
an additional mask with a mask opening being used for an implantation of the second type of conductivity, the mask opening of the additional mask extending over a region intended for the shallow well.

* * * * *